United States Patent
Burns et al.

(10) Patent No.: US 11,927,883 B2
(45) Date of Patent: Mar. 12, 2024

(54) METHOD AND APPARATUS TO REDUCE VARIATION OF PHYSICAL ATTRIBUTE OF DROPLETS USING PERFORMANCE CHARACTERISTIC OF DISPENSERS

(71) Applicant: CANON KABUSHIKI KAISHA, Tokyo (JP)

(72) Inventors: Steven Wayne Burns, Austin, TX (US); Logan L. Simpson, Coupland, TX (US); Matthew C. Traub, Austin, TX (US); Adam Shackleton, Austin, TX (US); Whitney Longsine, Austin, TX (US); Brent Andrew Snyder, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 897 days.

(21) Appl. No.: 15/942,121

(22) Filed: Mar. 30, 2018

(65) Prior Publication Data
US 2019/0302610 A1   Oct. 3, 2019

(51) Int. Cl.
  *G03F 7/00* (2006.01)
  *B29C 43/58* (2006.01)
  *B41J 2/045* (2006.01)

(52) U.S. Cl.
  CPC .......... *G03F 7/0002* (2013.01); *B29C 43/58* (2013.01); *B41J 2/04508* (2013.01); *B41J 2/04541* (2013.01); *B29C 2043/5825* (2013.01); *B29C 2043/5833* (2013.01); *B29C 2043/5891* (2013.01)

(58) Field of Classification Search
  CPC ........ B41J 2/00; B05B 12/004; B05B 12/082; B05B 12/084; G03F 7/0003
  See application file for complete search history.

(56) References Cited

U.S. PATENT DOCUMENTS

| | | | |
|---|---|---|---|
| 5,102,110 A | * | 4/1992 | Reynolds ................... B41J 2/48 270/1.03 |
| 8,119,052 B2 | | 2/2012 | Schumaker |
| 8,142,704 B2 | | 3/2012 | Wang et al. |
| 8,586,126 B2 | | 11/2013 | Schumaker |

(Continued)

FOREIGN PATENT DOCUMENTS

| JP | 2011-181829 A | 9/2011 |
|---|---|---|
| JP | 2011-228619 A | 11/2011 |

(Continued)

OTHER PUBLICATIONS

MicroFab Technologies, Inc.; "Ink-Jet Microdispensing Basic Setup;" www.microfab.com; Nov. 7, 2012; pp. 1-13.

(Continued)

*Primary Examiner* — Andrew D Graham
(74) *Attorney, Agent, or Firm* — CANON U.S.A., INC. IP Division (57) ABSTRACT

A performance monitor determines a performance characteristic of a plurality of dispensers receiving fluid from a reservoir. Each of the plurality of dispensers has an actuator that, when actuated, causes the each of the dispensers to generate a droplet of the fluid. A driver generates a drive command to the actuator to adjust a physical attribute of the droplet based on the performance characteristic to satisfy a performance criteria.

8 Claims, 8 Drawing Sheets

(56) References Cited

U.S. PATENT DOCUMENTS

| | | | |
|---|---|---|---|
| 8,647,554 B2 | 2/2014 | Jones et al. | |
| 9,223,202 B2 | 12/2015 | Choi et al. | |
| 9,616,614 B2 | 4/2017 | Choi et al. | |
| 2005/0157052 A1* | 7/2005 | Silverbrook | B41J 2/155 347/42 |
| 2005/0157136 A1* | 7/2005 | Silverbrook | B41J 15/02 347/102 |
| 2005/0158105 A1* | 7/2005 | Silverbrook | B41J 15/044 400/617 |
| 2005/0270312 A1 | 12/2005 | Lad et al. | |
| 2010/0096764 A1 | 4/2010 | Lu | |
| 2010/0098848 A1 | 4/2010 | Truskett et al. | |
| 2010/0112220 A1 | 5/2010 | Hodge et al. | |
| 2010/0265307 A1* | 10/2010 | Linton | C09D 11/38 347/100 |
| 2010/0302326 A1* | 12/2010 | Morohoshi | B41J 2/1433 347/86 |
| 2012/0120139 A1* | 5/2012 | Chiba | B41J 29/38 347/12 |
| 2012/0287186 A1* | 11/2012 | Tanaka | B41J 2/04588 347/10 |
| 2013/0004669 A1* | 1/2013 | Mataki | G03F 7/0002 427/277 |
| 2013/0010020 A1 | 1/2013 | Kodama | |
| 2013/0113863 A1 | 5/2013 | Kodama et al. | |
| 2013/0120485 A1 | 5/2013 | Kodama et al. | |
| 2013/0249981 A1* | 9/2013 | Nakagawa | G03F 7/0002 347/9 |
| 2014/0199472 A1 | 7/2014 | Kodama et al. | |
| 2014/0216141 A1* | 8/2014 | Zhou | B41J 2/04571 73/54.11 |
| 2014/0285550 A1 | 9/2014 | Kodama et al. | |
| 2016/0221230 A1 | 8/2016 | Mita et al. | |
| 2017/0235220 A1 | 8/2017 | Yamazaki et al. | |
| 2019/0168207 A1* | 6/2019 | Smith | B01L 3/02 |

FOREIGN PATENT DOCUMENTS

| | | |
|---|---|---|
| JP | 2012015324 A | 1/2012 |
| JP | 2012-204584 A | 10/2012 |
| JP | 5599205 B2 | 10/2014 |

OTHER PUBLICATIONS

S.V. Sreenivasan; "Nanoimprint lithography steppers for vol. fabrication of leading-edge semiconductor integrated circuits;" Microsystems & Nanoengineering (2017) 3, 17075; doi:10.1038/micronano.2017.75; www.nature.com/micronano; pp. 1-19.

Thomas Glinsner and Gerald Kreindl; "Nanoimprint Lithography;" EVGroup E. Thallner GmbH, Austria; ISBN: 978-953-307-064-3, InTech, http://www.intechopen.com/books/lithography/nanoimprint_lithography; pp. 495-517.

Makoto Shimoda et al.; "Penetration of Residual Layer in Nanoimprint Lithography by Direct Oxidation of Photocatalytic Film;" Department of Mechanical Engineering, The University of Tokyo;. Bunkyo-ku, Tokyo, Japan; pp. 1-4.

* cited by examiner

METHOD AND APPARATUS TO REDUCE VARIATION OF PHYSICAL ATTRIBUTE OF DROPLETS USING PERFORMANCE CHARACTERISTIC OF DISPENSERS

BACKGROUND OF THE INVENTION

Field of the Invention

One disclosed aspect of the embodiments relates to semiconductor fabrication applications. In particular, one disclosed aspect of the embodiments relates to techniques to reduce variation of physical attribute of droplets.

Description of the Related Art

Nanoimprint lithography (NL) has become an important technology in semiconductor manufacturing. NL offers many promising advantages over other technologies such as photolithography and extreme ultraviolet (EUV) lithography.

Among several NL processes, inkjet imprint lithography offers superb resolution and high throughput. A typical inkjet imprint lithography process uses inkjet techniques to dispense tiny volumes, in the order of pico-liter, of low viscosity ultraviolet (UV) curable resists. The inkjet dispensing of resist drops is typically the first step in the imprint process to deposit material that is correlated with the template relief pattern and/or substrate topography variation. Here, the term "template" refers to the nanoimprint master or replica in NL literature and has similar meaning as the term "mold" or "imprint mask." The drop volume and drop pattern of the dispensed UV curable resist not only depends on the template relief pattern and/or the substrate topography itself but also on the nature of fluid flow as a function of the template pattern or substrate topography type. Similar considerations apply when using a superstrate and drop dispensed material to form unpatterned layers over existing substrate topography.

The residual layer is a layer of the dispensed material that remains under the relief patterns of the template or that remains disposed between the superstrate and the substrate or wafer topography. This layer acts as a buffer to prevent direct contact with the underlying substrate and damage of the template or superstrate. The residual layer needs to be thin and uniform to maintain an accurate pattern transfer process.

SUMMARY OF THE INVENTION

A performance monitor determines a performance characteristic of a plurality of dispensers receiving fluid from one or more reservoirs. Each of the plurality of dispensers has an actuator that, when actuated, causes the each of the dispensers to generate a droplet of the fluid. A driver generates a drive command to the actuator to adjust a physical attribute of the droplet based on the performance characteristic to satisfy a performance criteria.

Further features of the disclosure will become apparent from the following description of exemplary embodiments with reference to the attached drawings.

DESCRIPTION OF THE EMBODIMENTS

One disclosed aspect of the embodiments includes a technique to control a dispensing system to provide uniform residual layer thickness by reducing variations of the physical attribute, such as volume or size or velocity (which affects drop placement), of the dispensed droplets. A performance monitor is configured to determine a performance characteristic of a plurality of dispensers receiving fluid from a reservoir. Each of the plurality of dispensers has an actuator that, when actuated, causes the corresponding dispenser to generate a droplet of the fluid. A driver generates a drive command to the actuator to adjust a physical attribute of the droplet based on the performance characteristic to satisfy a performance criteria. The performance characteristic may be a utilization rate of a subset of the dispensers or a variation of the physical attribute of the droplets.

Figure 1:
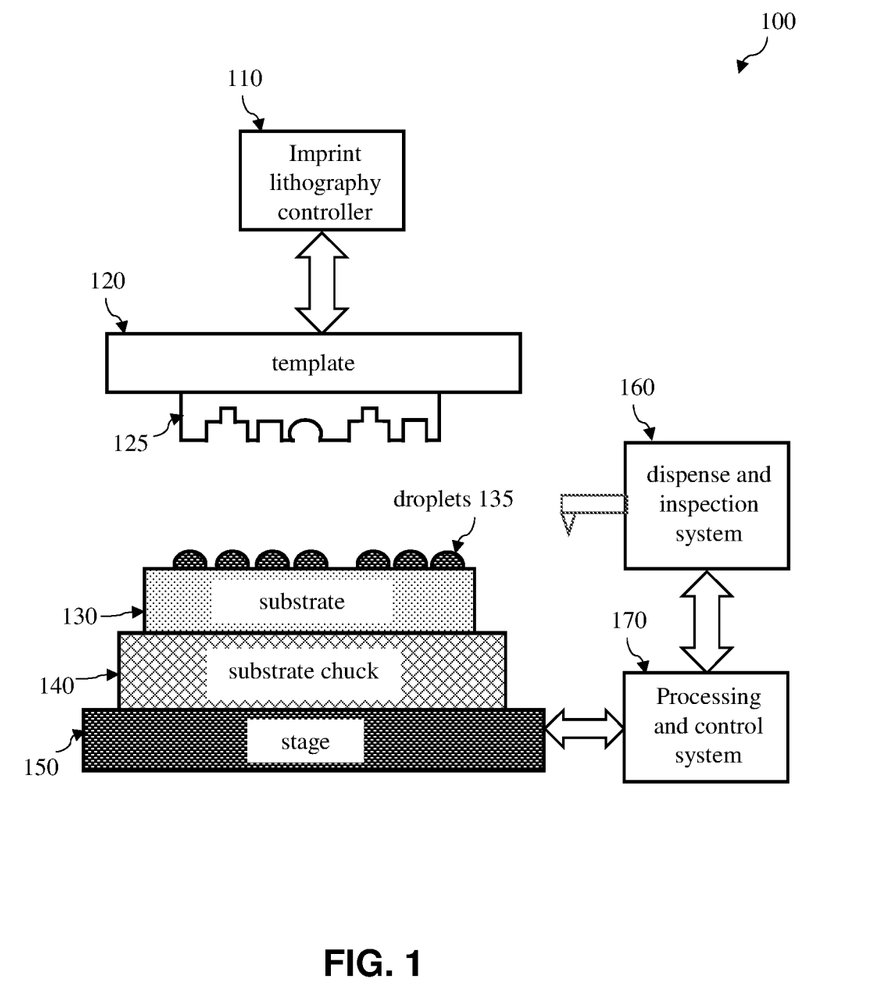
FIG. 1 is a diagram illustrating a system for nano-imprint lithography.

FIG. 1 is a diagram illustrating a system 100 for nanoimprint lithography. The system 100 includes an imprint lithography controller 110, a template 120 having a template pattern 125, a substrate 130, a substrate chuck 140, a stage 150, a dispense and inspection system 160, and a processing and control system 170. The system 100 may include more or less than the above components. The system 100 is configured to form a relief pattern on the substrate 130.

The imprint lithography controller 110 controls the positioning and movement of the template 120. It may include an energy source and an imprint head (not shown) which helps in the movement of the template 120, and associated control circuits. It may also be controlled by the processing and control system 170.

The template 120 may be made from a material such as quartz, silicon, organic polymers, or other suitable materials. The template pattern 125 includes features that have recesses and protrusions corresponding to the pattern to be formed on the substrate 130.

The substrate 130 may be coated with a thin adhesion layer to help in the adhesion to the resist after curing. It may be held by the substrate chuck 140 and both are positioned on the stage 150. The stage 150 may be controlled by the processing and control system 170 to move the substrate and substrate chuck assembly.

The dispense and inspection system 160 is configured to dispense liquid resist into droplets 135 on the substrate 130. It will be further described in FIG. 3. The processing and control system 170 provides user interface to a user and performs various control functions to other components in the system 100. It will be further described in FIGS. 4 and 10.

Figure 2:
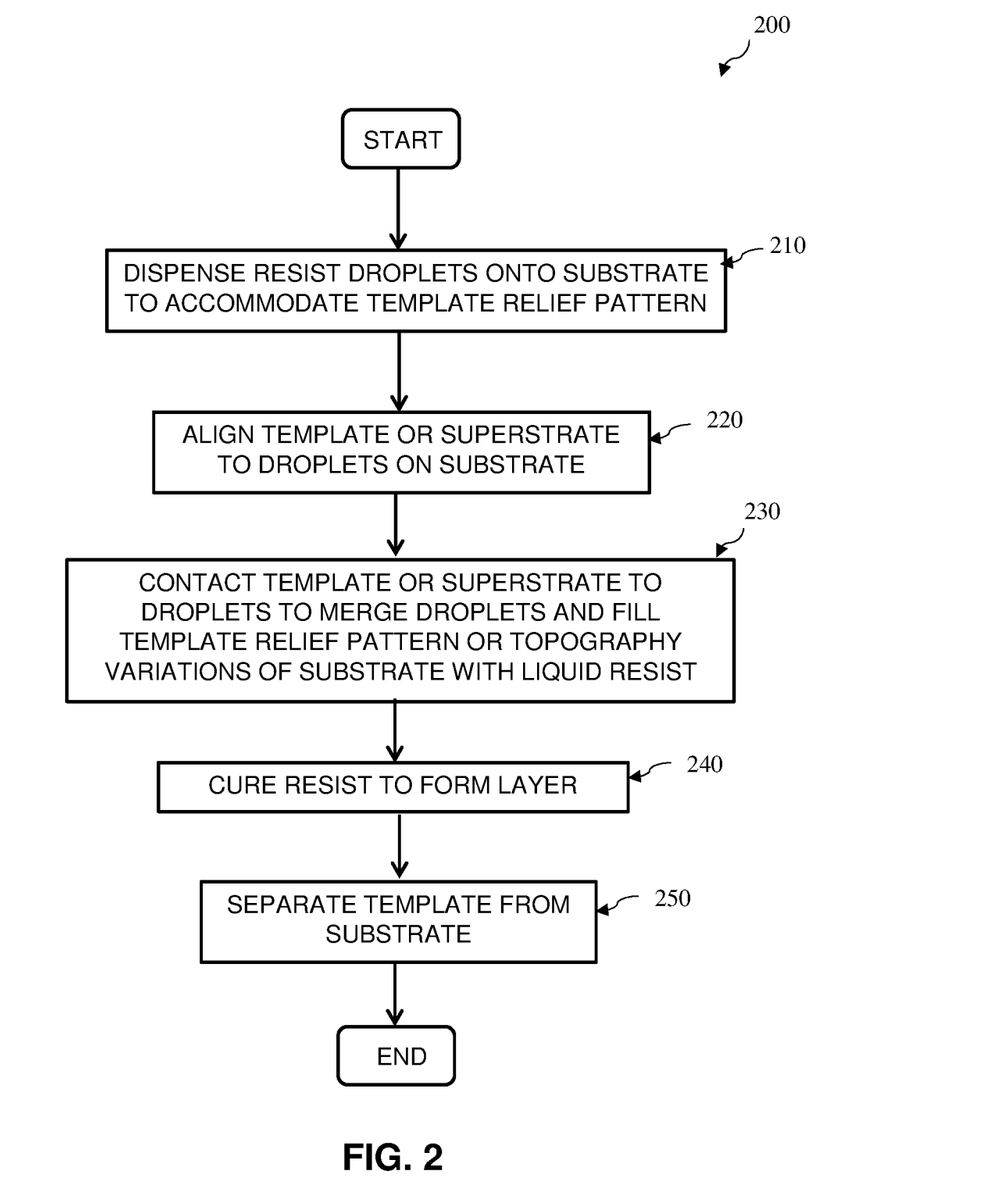
FIG. 2 is a diagram illustrating a process for nano-imprint lithography.

FIG. 2 is a diagram illustrating a process 200 for nanoimprint lithography. The process 200 represents a typical process for inkjet nano-imprint lithography. Upon START, the process 200 dispenses resist droplets onto the substrate in desired pattern to accommodate a template relief pattern (Block 210). The dispensing is such that the resulting residual layer thickness is uniform according to a predetermined criteria. Then, the process 200 aligns a template or a superstrate to the droplets on the substrate (Block 220). Next, the process 200 contacts the template to the droplets (Block 230). As the template or the superstrate contacts the droplets, the droplets merge and fill the features of the template relief pattern or topography variations of substrate with the liquid resists. Then, the process 200 cures the resist to form a patterned layer by ultraviolet (UV) (Block 240). Next, the process 200 separates the template from the substrate, leaving the cured patterned resist layer on the substrate (Block 250). The process 200 is then terminated. As an alternative, the process may use a superstrate and drop dispensed material to form unpatterned layer over existing substrate topography.

Figure 3:
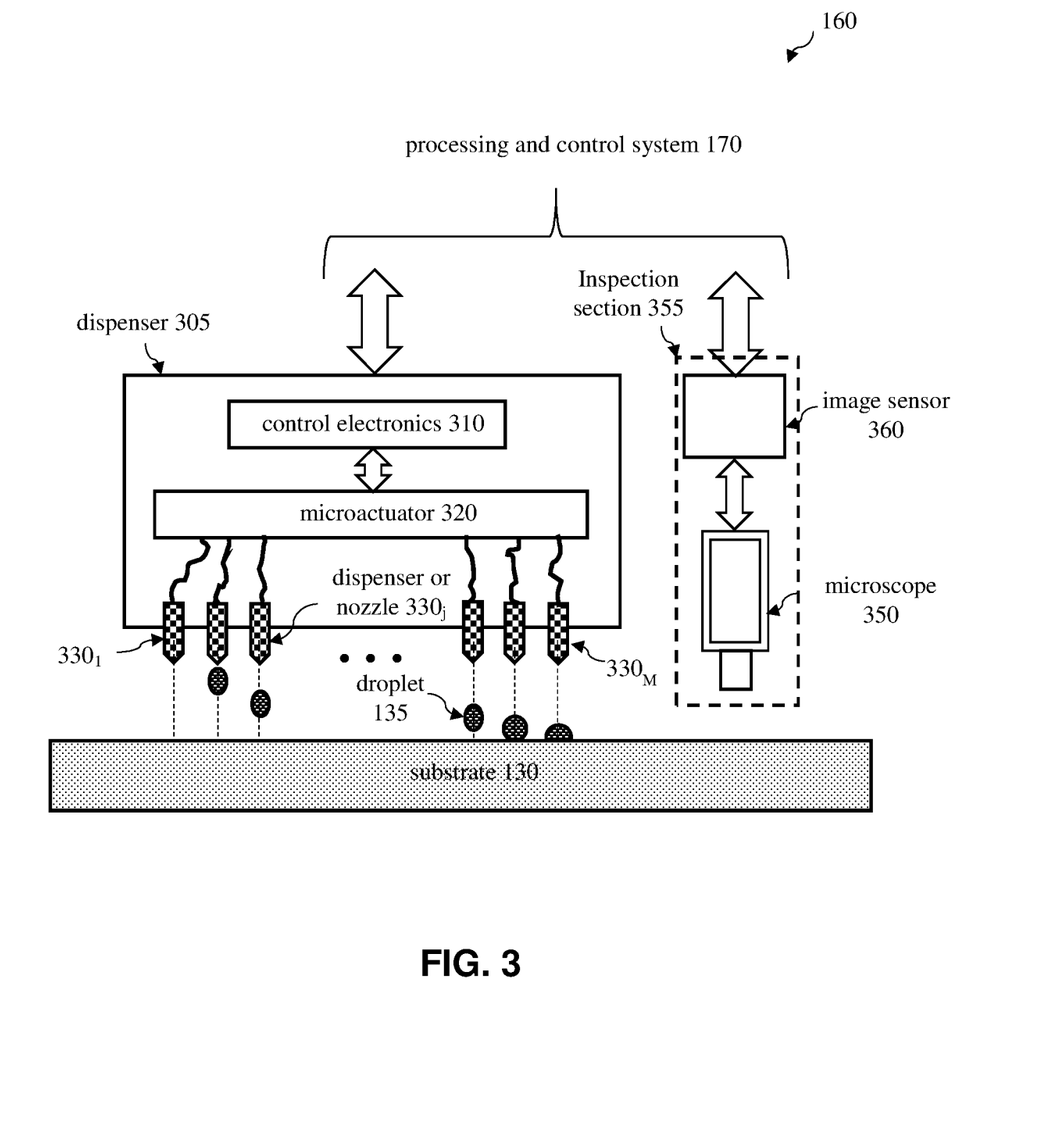
FIG. 3 is a diagram illustrating a dispense and inspection system.

FIG. 3 is a diagram illustrating the dispense and inspection system 160 shown in FIG. 1. The dispense and inspection system 160 communicates with the processing and control system 170 in carrying tasks such as to receive command from the processor in the processing and control system 170 and to transmit measurement information to the processor. It includes a dispenser 305 and an inspection section 355. The dispenser 305 includes a control electronics 310, a microactuator 320, and M dispensers or nozzles $330_j$'s where j=1, . . . , M. The inspection section 355 includes a microscope 350 and an image sensor 360. The dispense and inspection system 160 may include more or less than the above components. For example, user-based visual inspection can achieve the described inspection system function.

The M dispensers or nozzles $330_j$'s receive liquid resist or fluid from one or more reservoirs (not shown) through appropriate tubings and connectors. The microactuator 320 may include a number of actuators that are attached to the nozzles $330_j$'s to cause the nozzles $330_j$'s to dispense the droplets 135 of the liquid resist. Each actuator may generate or apply a force to the corresponding nozzle according to a control voltage or current provided by the control electronics 310. The control electronics 310 may include a number of circuits or applications specific integrated circuits (ASICs) that are designed to generate appropriate force over time on the nozzles upon receiving a drive command that corresponds to a control or trim voltage or current. The M dispensers or nozzles $330_j$'s may be formed into subsets of nozzles such that each subset is subject to the same drive command.

The physical attribute (e.g., size, volume, velocity) of the dispensed droplet depends on the amount of control voltage or current applied over time. Accordingly, by adjusting the drive command, which in turns adjusts the control voltage, the size, volume, or velocity of the droplet may be adjusted. If the adjustment of the drive command is such that the physical attribute of the droplets becomes uniform, the resulting RLT will also become uniform. One way to achieve a uniform physical attribute is to reduce the variation of the physical attribute. Accordingly, one way to achieve a uniform RLT is to reduce the variation of the physical attribute of the droplets. This can be performed by using the performance characteristic of the dispensers or nozzles $330_j$'s as discussed in the following.

The inspection section 355 provides measurement and/or detection of the droplets 135 and their formation on the substrate 130. In particular, it may provide measurements or quantitative information on the dispensed droplets 135 so that one or more physical attributes of each droplet may be obtained. The measurement may be performed manually using unaided visual inspection or automatically through techniques in machine vision and/or image analysis. The microscope 350 magnifies the image of the object (i.e., the droplet 135) being inspected. The image sensor 360 is a device (e.g., charge-coupled device, camera) that captures the image of the droplet 135. The image is then digitized and sent to the processing and control system 170 for analysis.

Figure 4:
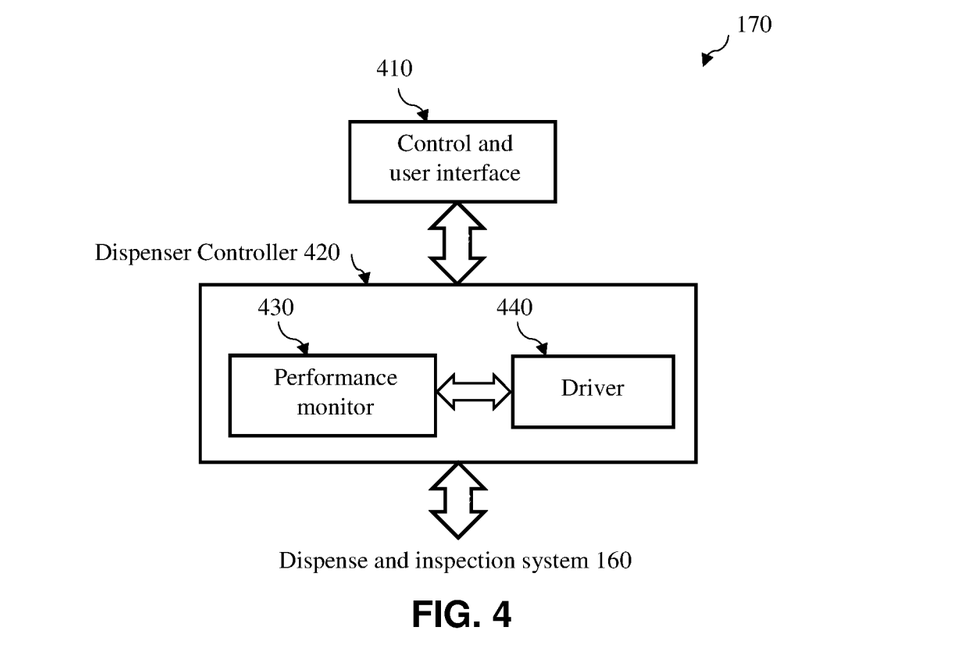
FIG. 4 is a diagram illustrating functionalities of a processing and control system.
Figure 10:
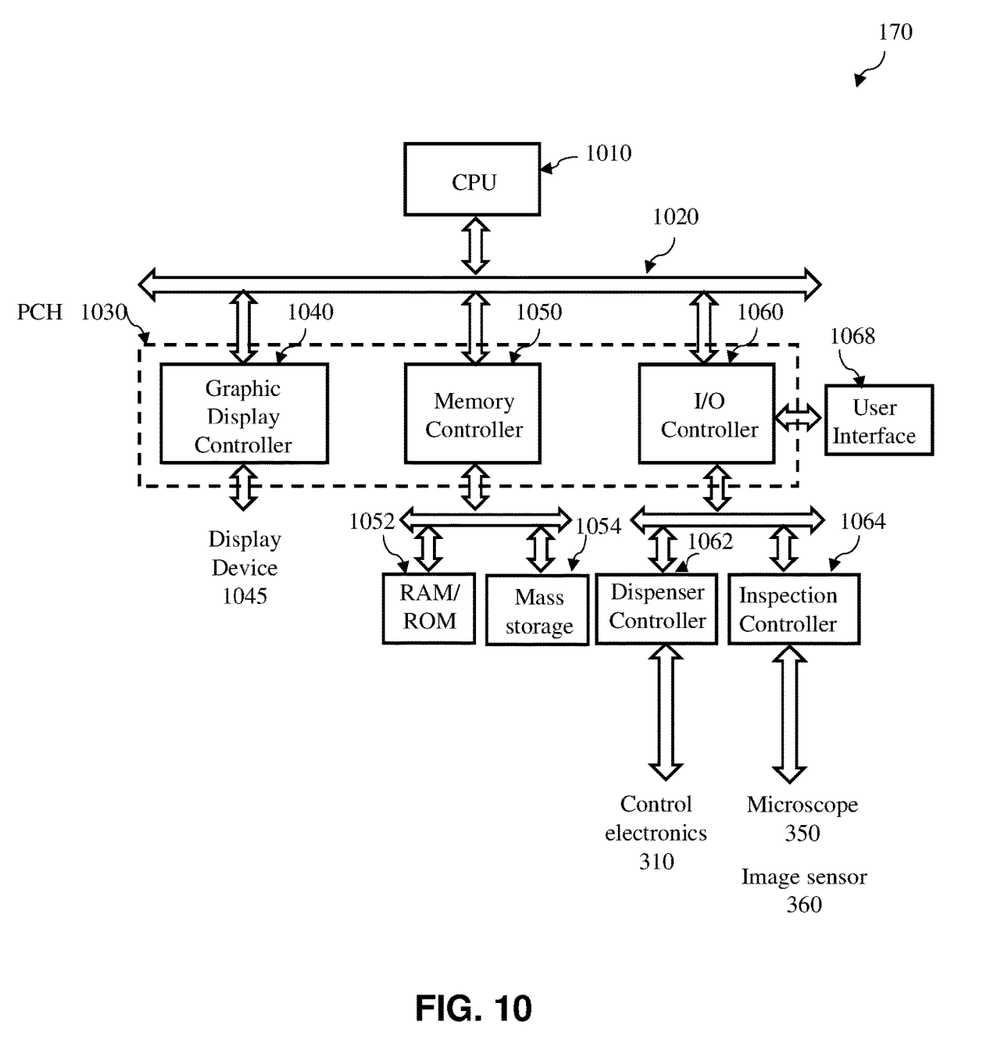
FIG. 10 is a diagram illustrating a processing and control system.

FIG. 4 is a diagram illustrating functionalities of the processing and control system 170 shown in FIG. 1. The processing and control system 170 includes the following functionalities: a control and user interface 410 and a dispenser controller 420. The dispenser controller 420 includes a performance monitor 430 and a driver 440. The functionalities may be implemented by one or more hardware circuits or one or more functions executed by a programmable processor as shown in FIG. 10.

The control and user interface 410 perform various control functions to the dispenser 305 and/or the imprint lithography controller 110. Examples of these functions may include generation of a drive command to the dispenser 305 to actuate a nozzle such that the nozzle dispenses a droplet having a desired physical attribute (e.g. size, volume, diameter, velocity). It may also include a functionality to perform image analysis of the images provided by the inspection section 355 regarding the droplets on the substrate 130. For example, it may calculate the volume or the size of the droplets based on the images obtained by the inspection section 355. It may also provide a user interface to allow a user to manually generate the drive command based on the observed droplets.

The performance monitor 430 is configured to determine a performance characteristic of the dispenser 305, or more particularly, the dispensing nozzles $330_j$'s. The performance characteristic may be a utilization rate of a subset of the dispensing nozzles $330_j$'s or a variation of the physical attribute of the droplets. The performance monitor 430 will be described in FIGS. 5 and 6.

The driver 440 is configured to generate a drive command to the actuator that is attached to a nozzle 330 to adjust the physical attribute of the droplet based on the performance characteristic to satisfy a performance criteria. In one embodiment, the drive command may correspond to a trim voltage that drives the actuator to the dispensing nozzle. The performance criteria is related to the uniformity of the resulting residual layer thickness. The uniformity of the RLT correlates to the variation of the physical attribute of the droplets. The less the variation is, the more uniform the RLT becomes. Therefore, by determining the variation of the physical attribute and using it as a feedback information to dictate the drive command, better uniformity of the resulting RLT may be achieved. In one embodiment, the performance criteria is expressed as a performance threshold that establishes the maximum limit of the variation of the physical attribute.

Figure 5:
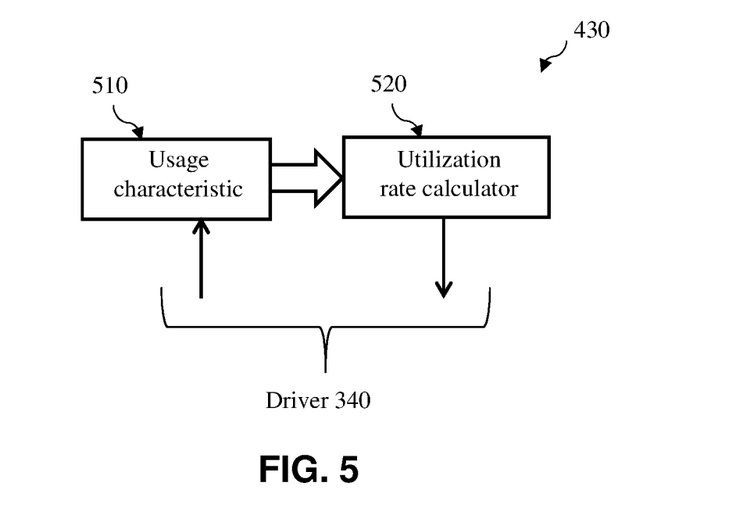
FIG. 5 is a diagram illustrating a performance monitor according to a first embodiment.

FIG. 5 is a diagram illustrating the performance monitor 430 shown in FIG. 4 according to a first embodiment. The performance monitor 430 includes a memory 150 that stores a usage characteristic 510 and a utilization rate calculator 520.

In this embodiment, the performance monitor 430 provides information to generate the drive command to the nozzles in an open-loop manner. In other words, the drive command is based on a pre-determined relationship between the utilization rate and the value of the physical attribute of the droplets. This relationship may be obtained through off-line experiments or calibration.

The utilization rate or usage rate is determined based on a dispense pass. A dispense pass is a pass in which the substrate is moved in a direction, typically perpendicular to, the dispense head orientation in a dispensing operation. It may take more than one pass to achieve the desired drop pattern. The utilization rate may be defined as the relative utilization of nozzles (or dispensers) within one group (such as those associated with a band shown in FIG. 8) as compared to the utilization of nozzles in another group over a given dispense rate. The term "utilization" may refer to the degree, or how much, the nozzles in the group are used within a given time period. The usage characteristic 510 represents this utilization for each group. The rate calculator 520 is configured to calculate the utilization rate as defined above. The calculated utilization rate may be used to guide the driver 440 to generate an appropriate drive command such as an appropriate control voltage, or trim voltage, to the nozzles.

Figure 6:
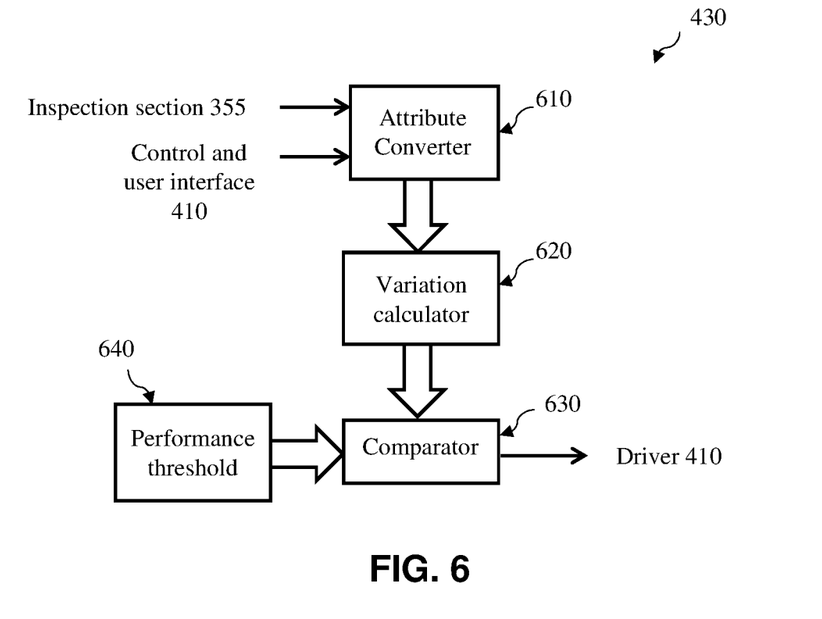
FIG. 6 is a diagram illustrating a performance monitor according to a second embodiment.

FIG. 6 is a diagram illustrating the performance monitor 430 shown in FIG. 4 according to a second embodiment. The performance monitor 430 includes an attribute converter 610, a variation calculator 620, a comparator 630, and a performance threshold 640. The performance monitor 430 may include more or less than the above components.

In this embodiment, the performance monitor 430 provides information to generate the drive command to the nozzles in a closed-loop manner. In other words, the drive command is based on feedback information regarding the performance of the dispensers. This feedback information may be provided by a user through the control and user interface 410 in an interactive manner. It may also be provided by the inspection section 355 that automatically determines the physical attribute of the droplets through techniques in machine vision or image analysis as discussed above.

The attribute converter 610 is configured to convert an input from either the inspection section 355 or the control and user interface 410, or both, into a value representing the physical attribute of the droplets. The physical attribute may be one of a size, a diameter, a volume, or a velocity.

The variation calculator 620 is configured to calculate the variation of the physical attribute of the droplets. The variation may be expressed as a variance of the values representing the physical attribute of the droplets. For example, the diameters of the droplets 135 may be obtained. The variation of the diameters is calculated as the variance of these droplets.

The comparator 630 is configured to compare the calculated variation with the performance threshold 640 and generates the result to the driver 410. The performance threshold 640 may be determined off-line during a calibration procedure, or dynamically updated on-line based on some heuristic learning algorithm.

Figure 7:
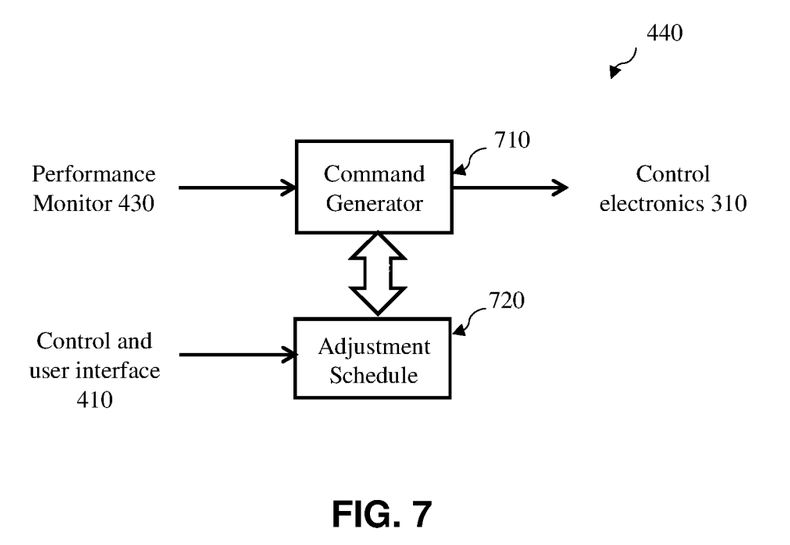
FIG. 7 is a diagram illustrating a driver.

FIG. 7 is a diagram illustrating the driver 440 shown in FIG. 4. The driver 440 includes a command generator 710 and an adjustment schedule 720. The driver 440 receives an input from the performance monitor 430 and/or the control and user interface 410 and generates a drive command to the control electronics 310.

The command generator 710 generates the drive command to the control electronics 310 based on the performance characteristic from the performance monitor 430 and the adjustment schedule 720. The adjustment schedule 720 is provided by the control and user interface 410. It may be a look-up table that translates the performance characteristic into values corresponding to the drive command. For example, the look-up table may translate the utilization rate into a control voltage. The look-up table may contain a range of values of the control voltage that correspond to a value of the utilization rate so that the drive command may be adjusted incrementally or iteratively until the performance criteria is satisfied.

Figure 8:
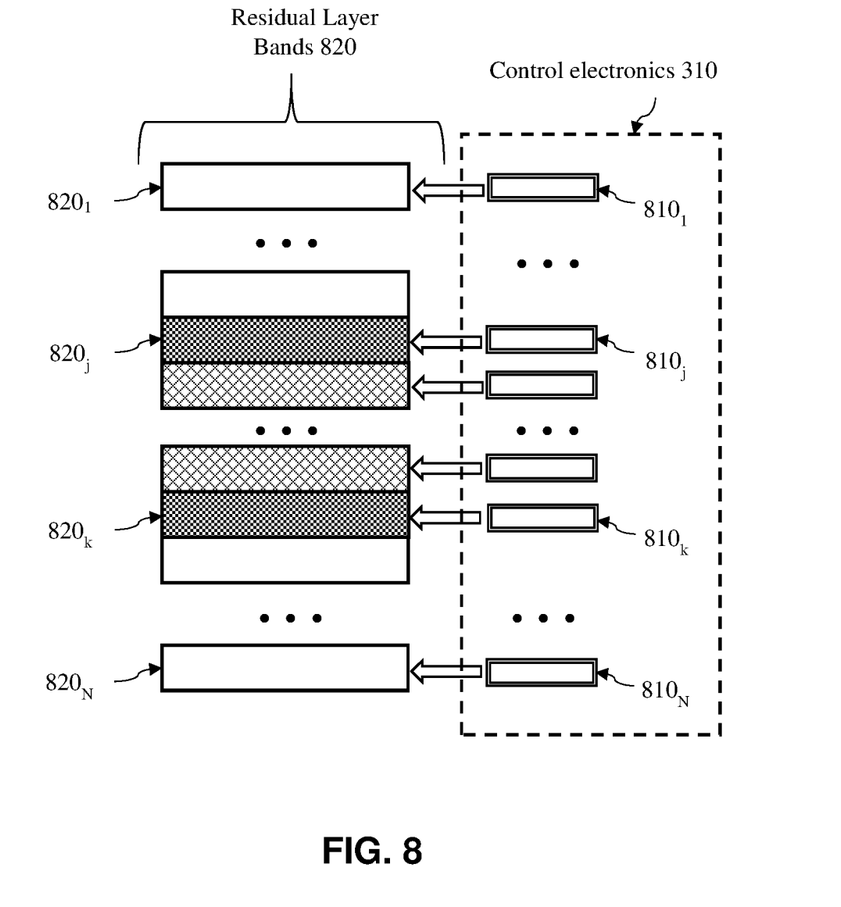
FIG. 8 is a diagram illustrating residual layer bands.

FIG. 8 is a diagram illustrating residual layer bands formed on a substrate. The residual layer bands form a region 820. It may include N bands $820_j$'s (j=1, ..., N). Typically the nozzles associated with bands are not used uniformly and that may lead to the non-uniformity of the residual layer thickness. For example, the nozzles associated with inner bands from $820_j$ to $820_k$ may be more heavily used than the outer bands from $820_1$ to $820_{j-1}$ and $820_{k+1}$ to $820_N$.

The bands $820_i$'s are the result of the dispensed droplets as ejected or dispensed by the nozzles $330_j$'s under the control of the control electronics 310. The control electronics 310 may have a number of specialized circuits $810_j$'s (j=1, ..., N) that are used to control the actuators. These circuits $810_j$'s may be ASICs designed to correspond to the nozzles $330_j$'s. The correspondence may be one-to-one as shown in FIG. 8, or one-to-many. In a one-to-many correspondence, a circuit 810 may correspond to a subset of the nozzles $330_j$'s which in turn correspond to a subset of the bands $820_i$'s.

Figure 9:
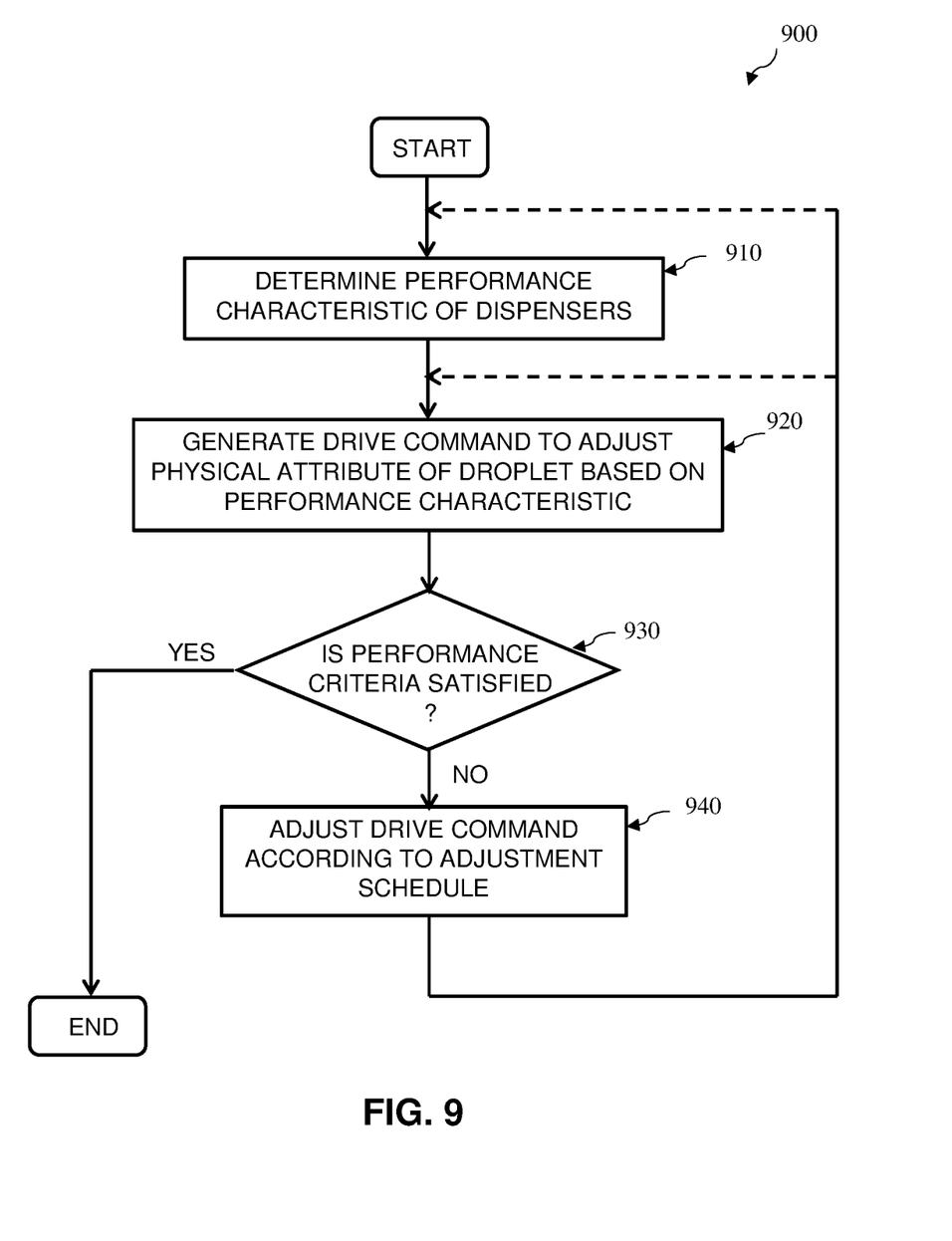
FIG. 9 is a diagram illustrating a process for dispensing droplets of resist.

FIG. 9 is a diagram illustrating a process 900 for dispensing droplets of resist. Upon START, the process 900 determines a performance characteristic of the dispensers (Block 910). Next, the process 900 generates a drive command to adjust a physical attribute of the droplet based on the performance characteristic (Block 920). The drive command may correspond to a circuit, such as the $810_j$ in FIG. 8, that provides a trim voltage to drive the actuator to the dispensing nozzle. Then, the process 900 determines if the performance criteria is satisfied (Block 93)). For example, the variation is compared to a variation threshold. If it is less than the threshold, the performance criteria is satisfied. If so, the process 900 is terminated. Otherwise, the process 900 adjusts the drive command according to an adjustment schedule (Block 940). The adjustment schedule may be a look-up table that provides incremental values for the drive command for a particular value of the performance characteristic. Then, the process 900 returns to Block 910 or Block 920 as appropriate. The process 900 is then repeated until the performance criteria is satisfied. Alternatively, the process 900 may be terminated after a pre-determined number of iterations has been reached.

FIG. 10 is a diagram illustrating the processing and control system 170 shown in FIG. 1.

The processing and control system 170 includes a central processing unit (CPU) or a processor 1010, a platform controller hub (PCH) 1030, and a bus 1020. The PCH 1030 may include a graphic display controller (GDC) 1040, a memory controller 1050, an input/output (I/O) controller 1060, and a mass storage controller 1054. The processing and control system 170 may include more or less than the above components. In addition, a component may be integrated into another component. As shown in FIG. 10, all the controllers 1040, 1050, and 1060 are integrated in the PCH 1030. The integration may be partial and/or overlapped. For example, the GDC 1040 may be integrated into the CPU 1010, the I/O controller 1060 and the memory controller 1050 may be integrated into one single controller, etc.

The CPU or processor 1010 is a programmable device that may execute a program or a collection of instructions to carry out a task. It may be a general-purpose processor, a digital signal processor, a microcontroller, or a specially designed processor such as one design from Applications Specific Integrated Circuit (ASIC). It may include a single core or multiple cores. Each core may have multi-way multi-threading. The CPU 1010 may have simultaneous multithreading feature to further exploit the parallelism due to multiple threads across the multiple cores. In addition, the CPU 1010 may have internal caches at multiple levels.

The bus 1020 may be any suitable bus connecting the CPU 1010 to other devices, including the PCH 1030. For example, the bus 1020 may be a Direct Media Interface (DMI).

The PCH 1030 in a highly integrated chipset that includes many functionalities to provide interface to several devices such as memory devices, input/output devices, storage devices, network devices, etc.

The I/O controller 960 controls input devices (e.g., stylus, keyboard, and mouse, microphone, image sensor) and output devices (e.g., audio devices, speaker, scanner, printer). It also has interface to a user interface 1068 which provides interface to a user including specialized input/output devices and a network interface card which provides interface to a network and wireless controller (not shown).

The memory controller 1050 controls memory devices such as the random access memory (RAM) and/or the read-only memory (ROM)1052, and other types of memory such as the cache memory and flash memory. The RAM 1052 may store instructions or programs, loaded from a mass storage device, that, when executed by the CPU 1010, cause the CPU 1010 to perform operations as described above. It may also store data used in the operations. The ROM 1052 may include instructions, programs, constants, or data that are maintained whether it is powered or not. The instructions or programs may correspond to the functionalities described above, such as the performance monitor 430 and the driver 440.

The GDC 1040 controls a display device 1045 and provides graphical operations. It may be integrated inside the CPU 1010. It typically has a graphical user interface (GUI) to allow interactions with a user who may send a command or activate a function. The GDC 1040 may display, on the display device, images of the color lights as collected from the sample in the human body.

The mass storage controller 1054 controls the mass storage devices such as CD-ROM and hard disk.

The I/O controller 1060 may include a dispenser controller 1062 and an inspection controller 1064. The dispenser controller 1062 may include switching circuits, drive circuits, or trim voltage generators to generate control voltages or currents to the actuators in the dispensers. The inspection controller 1064 performs control functions related to the microscope 350 and the image sensor 360, such as start and stop capturing images, etc.

Additional devices or bus interfaces may be available for interconnections and/or expansion. Some examples may include the Peripheral Component Interconnect Express (PCIe) bus, the Universal Serial Bus (USB), etc.

All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. An apparatus comprising:
a performance monitor configured to determine a performance characteristic of a plurality of dispensers receiving fluid from a reservoir, wherein each of the plurality of dispensers has an actuator that, when actuated, causes the each of the dispensers to generate a droplet of the fluid on a semiconductor substrate in a nanoimprint lithography system; and
a driver configured to generate a drive command to the actuator to adjust a physical attribute of the droplet based on the performance characteristic to satisfy a performance criteria related to uniformity of a residual layer thickness,
wherein the drive command is based on feedback information related to variation of the physical attribute,
wherein the variation includes a variance of values representing the physical attribute,
wherein the driver comprises:
an adjustment storage configured to store an adjustment schedule for adjusting the drive command by translating the performance characteristic into values corresponding to the drive command; and
a command generator configured to generate the drive command based on the performance characteristic and the adjustment schedule,
wherein the performance monitor comprises:
a memory configured to store a usage of the plurality of dispensers; and
a rate calculator configured to calculate the utilization rate of a subset of the plurality of dispensers based on the usage, and
wherein the driver generates the drive command corresponding to the utilization rate calculated by the rate calculator based on a correspondence between the utilization rate and the values corresponding to the drive command.

2. The apparatus according to claim 1, wherein the performance characteristic includes one of a utilization rate of a subset of the plurality of dispensers and a variation of the physical attribute.

3. The apparatus according to claim 2, wherein the performance monitor comprises:
- an attribute converter configured to convert an input to the physical attribute, the input being from at least one of a user interface and an inspection section that inspects the droplet; and
- a variation calculator configured to calculate the variation of the physical attribute.

4. The apparatus according to claim 3, wherein the performance monitor further comprises:
- a comparator configured to compare the variation with a performance threshold.

5. The apparatus according to claim 2, wherein the physical attribute includes one of a size, a diameter, a volume, and a velocity.

6. The apparatus according to claim 1, wherein the drive command specifies a control voltage or current to a control circuit that actuates the actuator.

7. The apparatus according to claim 1, wherein the performance characteristic is a relative utilization of a first group of dispensers within the plurality of dispensers as compared to a nozzle utilization of nozzles in a second group of dispensers in the plurality of dispensers over a dispense rate.

8. The apparatus according to claim 1, wherein the driver further comprises:
- a look-up table containing the correspondence; and
- the command generator is further configured to generate the drive command corresponding to the utilization rate calculated by the rate calculator based on the look-up table.

* * * * *